AUTOMATIC GAIN CONTROL CIRCUITS

Filed June 2, 1965 2 Sheets-Sheet 1

INVENTOR
GEORGE H. KAM
BY
ATTORNEY

Feb. 6, 1968 G. H. KAM 3,368,156

AUTOMATIC GAIN CONTROL CIRCUITS

Filed June 2, 1965 2 Sheets-Sheet 2

INVENTOR
GEORGE H. KAM

BY

ATTORNEY

United States Patent Office 3,368,156
Patented Feb. 6, 1968

3,368,156

AUTOMATIC GAIN CONTROL CIRCUITS

George H. Kam, Tonawanda, N.Y., assignor to Sylvania Electric Products Inc., a corporation of Delaware Filed June 2, 1965, Ser. No. 460,872
10 Claims. (Cl. 330—18)

ABSTRACT OF THE DISCLOSURE

An automatic gain control circuit in which the input to common terminal signal path of an amplifier is shunted with a control amplifier which operates in response to a direct current biasing signal to control the gain of the amplifier by a combination of signal shunting, negative feedback, and reverse biasing. In one embodiment, a single transistor common emitter amplifier is controlled by a second transistor, base biased in response to an automatic gain control voltage, having its base electrode coupled to the input terminal of the common emitter amplifier, its collector electrode coupled to RF ground, and its emitter electrode coupled directly to the emitter electrode of the amplifier transistor so as to share its emitter resistor. In another embodiment, a cascode amplifier, comprising a first transistor connected as a common emitter and a second transistor connected as a common base, is controlled by a third transistor, of common base configuration, which is connected so as to control the gain of the second transistor. The input signal is connected from the collector of the first transistor to the emitter electrodes of the second and third transistors. The junction of the emitter electrodes of the second and third transistors is also connected to the base electrode of the first transistor thereby to increase the forward bias of the first transistor in the presence of strong input signals. The gain control signal is applied to the base of the third transistor, and a voltage divider is connected at the base of the second transistor to keep the bias voltage at that point relatively constant. The collector of the second transistor is coupled to an output load and the collector of the third transistor is coupled to RF ground.

This invention relates generally to amplifier circuits, and more particularly to automatic gain control (AGC) circuits for radio frequency amplifiers of wide dynamic range, especially transistorized amplifiers.

It is common practice to provide radio receivers with automatic gain control circuits to maintain the amplitude of the signal applied to the detector as nearly constant as possible over a relatively wide range of variation in the amplitude of the received signal. In transistorized receivers this is usually accomplished by using a portion of the rectified received radio signal to produce a direct current voltage, of appropriate polarity, which is proportional to the average value of the signal and applying it to the transistor base electrodes of the radio frequency, intermediate frequency and/or converter sections of the receiver to control the gain thereof inversely with respect to signal strength. That is, a large input signal produces a large AGC signal, the polarity of which is such that when applied to bias the base electrode of a transistor amplifier stage, the emitter current is reduced, thus decreasing the gain of the amplifier and reducing the amplitude of the signal applied to the detector. This method of gain control may be called "reverse biasing."

Exclusive use of the "reverse bias" method to achieve gain control presents a number of problems and is especially unsuitable in wide dynamic range receivers and amplifiers. When the AGC signal acts to alter the bias conditions in controlling transistor gain, this is reflected as a shift in bandwidth in center frequency due to changes in the input and output impedances. For example, in a common emitter stage, decreasing $I_e$ to reduce the gain results in an increase in input impedance and reduction of the bandwidth of a parallel tuned circuit (due to increased Q) and an upward shift of the center frequency. The dynamic range of the amplifier is thus compressed by detuning as the operating point of the transistor approaches either cut-off or saturation.

In low level RF stages, the nonlinearity introduced by the reduction of emitter current bias in the presence of a high input signal results in excessive intermodulation distortion beyond approximately 20 to 30 db of gain control. A known method of reducing this distortion is to control gain by varying the negative or degenerative feedback of the amplifier; prior art negative feedback approaches, however, have a relatively limited gain control range and do not cope with the problem of input and output impedance variations.

Accordingly, it is a principal object of this invention to provide an improved, relatively distortion-free automatic gain control circuit for a transistorized amplifier.

It is a more particular object of the invention to provide an automatic gain control circuit for an amplifier which will provide greater control range per stage with maximum linearity over the entire control range, thereby providing low intermodulation distortion and low harmonic generation at high input signal levels.

Another object is to provide an improved automatic gain control circuit for a wide dynamic range amplifier which will maintain relatively constant input impedance and output capacity.

A further object is to provide an improved transistorized amplifier circuit adapted for automatic gain control which will retain maximum linearity throughout the gain control range, maintain relatively constant input impedance, and obviate the need for neutralization.

Briefly, these objects are attained by shunting the input to common terminal signal path of an amplifier stage with a control amplifier which operates in response to a D.C. biasing signal to control the gain of the amplifier stage by a combination of signal shunting, negative feedback, and reverse biasing. With this approach, a greater gain control range is provided and maximum linearity is retained throughout the control range, characteristics of vital importance in the operation of wide dynamic range amplifiers. More specifically, these improvements in the characteristics of a wide dynamic range amplifier are achieved by applying the AGC signal to control the operating point of the control amplifier to thereby vary its gain in response to changes in magnitude of the AGC signal. The control amplifier is thereby operative to vary both the degenerative signal feedback of the amplifier stage and the direct current bias voltage at the common terminal thereby to control the gain of the amplifier stage in a reciprocal manner with respect to the gain variation of the control amplifier.

Since the input of the control amplifier is coupled to the signal input of the amplifier stage, the increase in control amplifier gain with reduction in amplifier stage gain results in a relatively constant input impedance being retained at the common input terminal. Further, this circuit configuration enables active degeneration of the amplifier stage whereby the negative feedback between the input and common terminals is controlled without phase inversion to insure linearity of operation. In addition, D.C. bias variations are employed cooperatively with the negative feedback to provide a wider range of control than that attainable with degenerative control alone.

In a transistorized embodiment of the invention these improvements in the control characteristics of an amplifier stage are achieved by addition of a control transistor, the emitter and base electrodes of which are respectively coupled to the emitter and base electrodes of a transistor in the amplifier stage. Application of a direct current AGC voltage as base bias for the control transistor is thereby effective to control the signal impedance in the emitter circuit of the amplifier transistor and also to provide a direct current circuit action of reverse biasing the amplifier transistor. In one embodiment of the invention, a single transistor common emitter amplifier is controlled by a second transistor, base biased in response to AGC voltage, having its base electrode coupled to the input terminal of the common emitter amplifier, its collector electrode coupled to RF ground, and its emitter electrode coupled directly to the emitter electrode of the amplifier transistor so as to share its emitter resistor.

In a second embodiment of the invention, a cascode amplifier comprising a first transistor connected in a common emitter configuration and a second transistor connected as a common base is controlled by a third transistor, of common base configuration, which is connected so as to control the gain of the second transistor. In this circuit, the input signal is connected from the collector of the first transistor to the emitter electrodes of the second and third transistors. The junction of the emitter electrodes of the second and third transistors is also connected to the base electrode of the first transistor thereby to increase the forward bias of the first transistor in the presence of strong input signals, thus preventing overdriving of the transistor with resulting clipping and distortion. The cascode amplifier combines high input impedance, high output impedance, and good isolation between input and output circuits, thereby eliminating the need for neutralizing circuitry. The invention is also applicable to vacuum tube amplifiers by use of analogous circuit connections.

Other objects, features, and advantages of the invention, and a better understanding of its operation, will become apparent from the following description, reference being had to the accompanying drawings, in which.

Figure 1:
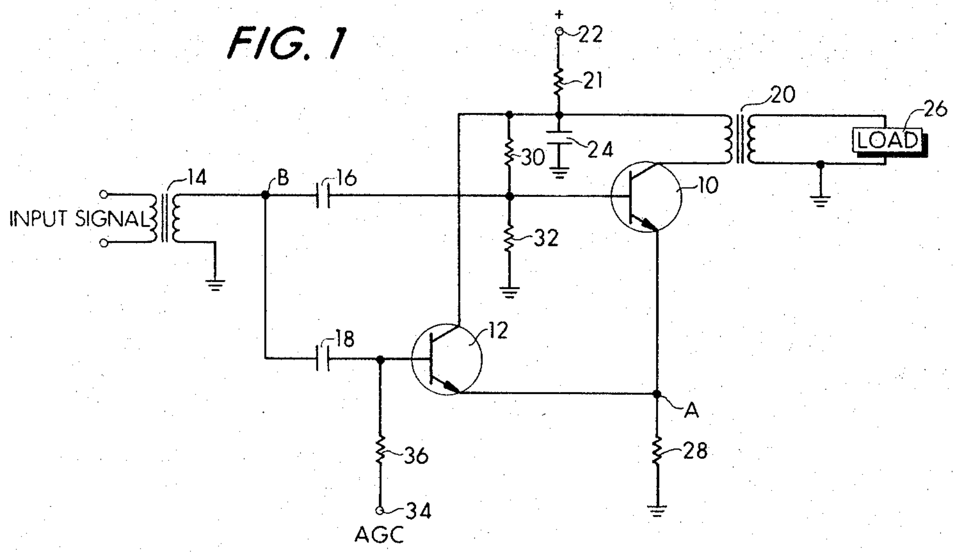
FIG. 1 is a schematic diagram of a transistorized circuit embodiment of the automatic gain control circuit of the invention in circuit with a common emitter amplifier.

Referring to FIG. 1, a first embodiment of the invention is shown comprising a common emitter amplifier including transistor 10 in combination with a control amplifier including a transistor 12 connected in a common collector configuration. Input signals, from a source such as an antenna or radio frequency amplifier are applied across the terminals of the primary winding of an impedance matching transformer 14. One terminal of the secondary winding of the transformer is connected in parallel through coupling capacitors 16 and 18 to the base electrodes of transistors 10 and 12, respectively, and the other terminal is connected to ground. The collector electrode of transistor 10 is connected to one terminal of the primary winding of an impedance matching output transformer 20, the other terminal of the primary being connected via a signal decoupling resistor 21 to a source of positive direct current voltage, represented by terminal 22, and via signal bypass capacitor 24 to ground; this connection provides a fixed supply voltage for the collector of transistor 10. A load 26, which may be another amplifier stage or a detector, is connected across the secondary winding of transformer 20.

The emitter electrode of transistor 10 is connected through a resistor 28 to ground, and the base is connected to a voltage divider network including a resistor 30 connected in series with resistor 21 and source 22 and a resistor 32 connected between the base electrode and ground. The values of resistors 30 and 32 are selected so as to keep the D.C. bias voltage at the base of transistor 10 relatively constant when AGC is applied to the amplifier. The emitter of transistor 12 is connected directly to the emitter of transistor 10, thereby sharing emitter resistor 28 with transistor 10. The collector electrode of transistor 12 is connected via signal bypass capacitor 24 to ground and via resistor 21 to the positive D.C. voltage source at terminal 22. A source of AGC voltage, represented by terminal 34, which may be obtained from the filtered output of a subsequent detector stage, is applied through a resistor 36 to the base electrode of transistor 12 to thereby control the operating point of transistor 12 and vary its gain in response to changes in magnitude of the AGC signal.

In operation, when the AGC voltage at terminal 34 is at its minimum level, control transistor 12 is biased to cut-off, thereby allowing all the signal current to flow through the common emitter amplifier, transistor 10. Consequently, transistor 10 is operating in its maximum gain condition. The base-emitter junction of transistor 10 is forward-biased by the positive voltage established at its base electrode by voltage divider resistors 30 and 32. For example, if the base of transistor 10 is at +3.6 v. DC, the voltage at the emitter, junction point A, will be about +3.0 v. DC, allowing for approximately 0.6 v. DC base-emitter drop.

As the AGC voltage at the base of transistor 12 is increased, approaching the fixed D.C. bias voltage at the base of transistor 10, transistor 12 will begin to conduct. With transistor 12 conducting, linear gain control of the common emitter amplifier is provided by means of three cooperating functions of the common collector circuits. First, since the base of transistor 12 is coupled to the input signal source, the control transistor will shunt a portion of the signal current to ground via capacitor 24. Second, as the AGC voltage becomes more positive with increasing signal strength, the D.C. voltage at junction point A increases correspondingly, thereby tending to reverse-bias transistor 10, which has a fixed D.C. base bias voltage. Hence, increasing the AGC results in a decrease in the base-emitter D.C. voltage differential, $V_{BE}$ in transistor 10. This reduces the emitter current, $I_e$, of transistor 10, thereby reducing its signal gain.

The third and most important aspect of the control amplifier operation is the increase in negative or degenerative feedback provided with increasing AGC voltage. As mentioned above, transistor 12, when caused to conduct in response to the AGC signal, shunts some input signal current to ground and tends to reduce the gain of transistor 10 by reverse-biasing. Both of these actions reduce the signal current through the base-emitter junction of transistor 10. In the absence of transistor 12, such a reduction of emitter signal current would tend to decrease the signal voltage at the emitter terminal of transistor 10 (junction A) and cause non-linear operation of the amplifier with resulting harmonic distortion at high input signal levels. It is well known that the addition of negative feedback to an amplifier stage will improve frequency response and the linearity in the ratio of output to input voltage, and reduce intermodulation distortion and harmonic generation in the output. Further, the improved amplifier characteristics are in direct proportion to the magnitude of the negative feedback applied. Of course, an increase in negative feedback also reduces the gain of the amplifier. The control amplifier of the present invention applies active negative feedback in a unique manner to provide these improvements along with a number of others in the gain control of a wide dynamic range amplifier stage.

In FIG. 1, active negative feedback is increased with increasing AGC by varying the effective signal impedance or resistance to ground at the emitter of transistor 10, in response to the AGC signal, to establish the proper amount of signal degeneration. This is accomplished by AGC control of the gain of transistor 12, and hence the input signal current shunted from the input terminal to the common terminal of the transistor 10 amplifier via capacitor 18 and the base-emitter of transistor 12. It was noted above that the signal shunting and reverse biasing effected by transistor 12 in response to the base applied AGC voltage results in a reduction in base-emitter signal current in transistor 10 which, in the absence of transistor 12, would tend to decrease the signal voltage at junction point A. With transistor 12 in circuit, however, this decrease in signal voltage is offset by an increase in signal voltage as a result of the signal current shunted through to point A by an increase in the gain of control transistor 12. Consequently, the signal current through resistor 28 and the signal voltage, *e*, at junction point A remains relatively constant with variations in AGC voltage and the resulting variation in the gain of transistor 12 and the base-emitter signal current, *i*, of transistor 10. As a result, the effective signal impedance seen by the emitter of transistor 10, i.e., the effective emitter load impedance $Z=e/i$, will be increased as the AGC voltage is increased and *i* becomes smaller with *e* remaining relatively constant. By variation of the emitter impedance in this manner, an increasing AGC voltage is operative to increase the emitter degeneration of the amplifier or supply negative feedback to transistor 10 which reduces its gain and maintains linearity.

Another way of viewing this negative feedback operation is that by varying the effective impedance of emitter resistor 28 for transistor 10, the proportion of the transistor 10 input signal applied between its base and emitter terminals is controlled relative to the proportion of the transistor 10 input signal applied between the emitter terminal and ground, whereby the signal gain is controlled.

It is quite apparent, therefore, that the gain of transistor 10 is controlled by the mutually assisting actions of signal shunting reverse biasing, and negative feedback. Further, in view of the shunt arrangement of the transistors with their signal inputs coupled together at a junction point B and their emitter electrodes connected at a junction point A so as to share a common emitter resistor 28, the gains of transistors 10 and 12 will vary in a reciprocal manner. That is, as the gain of transistor 12 is varied from cut-off to the "full on" condition in response to the base applied AGC voltage, the gain of transistor 10 will vary from "full on" to cut-off. Of course, negative feedback alone is not sufficient to extend the gain control range of transistor 10 to cut-off; this is accomplished by the reverse biasing action. That is, since the applied negative feedback is a function of the gain of the emitter follower transistor 12, which will never reach the ideal maximum gain level of unity, the maximum negative feedback obtainable via transistor 12 will not in itself be sufficient to reduce the gain of transistor 10 to cut-off. Hence, once the maximum gain of transistor 12 is reached, as determined by its beta characteristics, further increase in AGC voltage results in an increase in the D.C. voltage at junction A to thereby reduce the gain of transistor 10 to cut-off by reverse biasing. In this state, all of the input signal current is shunted to ground via transistor 12 and virtually zero current flows through the primary of transformer 20; ideally this would be a zero gain condition, but there will actually be some finite signal present due to capacitive coupling across transistor 10.

This technique of applying degenerative feedback by means of a control amplifier shunting the input to common terminal signal path of the amplifier stage enables increasing the base-emitter negative feedback of transistor amplifier 10 without phase inversion and in a manner which results in a truly linear operation of the amplifier. Further, since the transistors have a common input terminal at junction point B and their gains vary in a reciprocal manner, the input load as "seen" at junction point B will be relatively constant with varying AGC. As for output capacity, which is a function of $V_{CB}$, the direct current voltage drop across the base-collector junction, this will also remain relatively constant since the base bias and collector supply voltages of transistor 10 are held fixed.

The experimental data shown in the following table illustrates the significant reduction in intermodulation distortion achieved by use of the circuit arrangement shown in FIG. 1, as compared with an amplifier employing conventional reverse biasing for automatic gain control. In this test, the input voltage comprised a two tone signal supplied by a pair of signal generators over the voltage range indicated. For a constant output voltage, the intermodulation distortion was measured by use of a spectrum analyzer. The db figures indicate the level of undesired harmonics in the output with respect to the two original frequencies.

| Input Voltage (RMS) (Two Tone Signal) | Intermodulation Distortion, db | |
|---|---|---|
| | (Conventional Reverse Biasing) | (Fig. 1 Circuit) |
| 100 μvolts | −40 | −40 |
| 318 μvolts | −40 | −40 |
| 1 mv | −40 | −40 |
| 3.8 mv | −35 | −40 |
| 10 mv | −28 | −40 |
| 31.8 mv | −28 | −40 |
| 100 mv | −17 | −25 |
| 318 mv | −5 | −20 |

Figure 2:
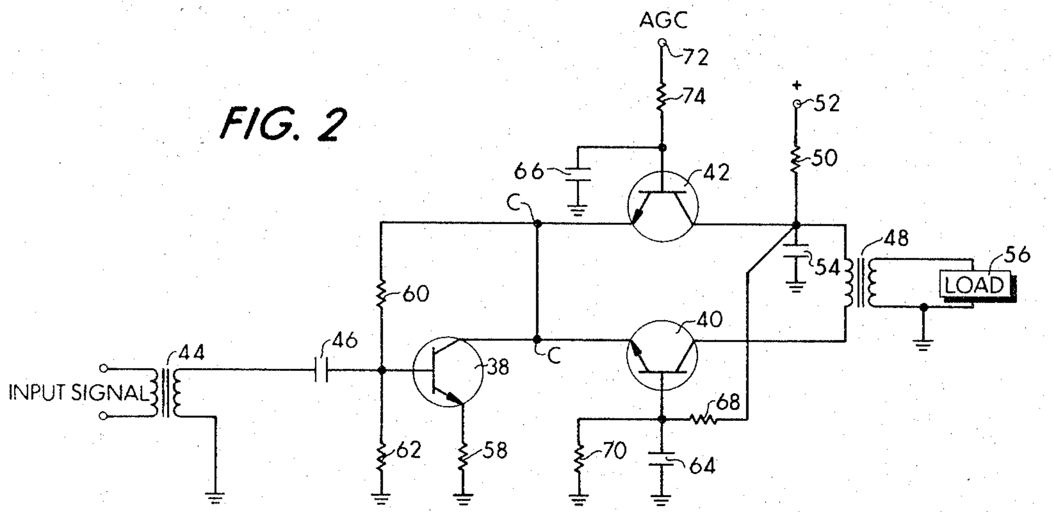
FIG. 2 is a schematic diagram of a transistorized circuit embodiment of the automatic gain control circuit of the invention arranged to control a cascode amplifier.

Referring now to FIG. 2, a second embodiment of the invention is shown as applied to the control of a cascode amplifier. The cascode amplifier comprises a transistor 38 connected in a common emitter configuration and a transistor 40 connected as a common base amplifier. The gain of transistor 40 is controlled by another common base transistor amplifier 42 in an analogous manner to that in which transistor 10 is controlled by transistor 12 in the circuit of FIG. 1.

The input signal is applied across the primary winding of an impedance matching transformer 44, one terminal of the secondary of which is connected to the base electrode of transistor 38 through a coupling capacitor 46, with the other terminal connected to ground. The collector electrode of transistor 38 is directly connected to the emitter electrodes of both of transistors 40 and 42 (junction point C), and the collector electrode of transistor 40 is connected to one terminal of the primary winding of an impedance matching output transformer 48, the other terminal of which is connected via a signal decoupling resistor 50 to a source of positive direct current voltage, represented by terminal 52, and via a signal bypass capacitor 54 to ground, this connection providing a relatively fixed supply voltage at the collector of transistor 40. A load 56 is connected across the secondary winding of transformer 48.

The emitter electrode of transistor 38 is connected through a resistor 58 to ground, and the base electrode is connected to a bias source provided by a voltage divider comprising resistors 60 and 62. Resistor 60 is connected between the base of transistor 38 and junction point C, and resistor 62 is connected between the base of transistor 38 and ground. The base electrodes of transistors 40 and 42 are connected to ground via coupling capacitors 64 and 66, respectively, and the collector electrode of transistor 42 is connected via signal bypass capacitor 54 to ground and via resistor 50 to the positive D.C. voltage source at terminal 52. A fixed bias voltage is maintained at the base of transistor 40 by a voltage divider comprising a resistor 68, connected in series with resistor 50 to source 52, and a resistor 70 connected between the base of transistor 40 and ground. The base bias, and hence operating point and gain, of transistor 42 is controlled by a source of AGC voltage applied at terminal 72 through a resistor 74 to the base electrode of this transistor.

With reference to the cascode ampifier stage, transistor 40, being a common base amplifier, provides a very high output impedance for the stage but a very low input impedance as the collector signal load for the common emitter amplifier transistor 38. With such a collector load, transistor 38 has a very low voltage gain, typically less than unity. Hence, transistor 38 is basically a current amplifier which serves to transform the low input impedance of transistor 40 to a much higher value (by approximately the beta multiplication of transistor 38). Also, with such degeneration of the voltage gain of the common emitter amplifier, the signal feedback through the collector-to-base capacitance of transistor 38 is considerably reduced, thereby insuring stability of operation and eliminating the need for neutralization of unilateralization over a wide frequency range of tuned operation.

In a typical application, transistors 40 and 38 are connected in series between +12 v. DC, at terminal 52, and ground. Transistor 40 is forward biased at approximately +3.6 v. DC from the voltage divider comprising resistors 68 and 70, the values of which, as mentioned above, are selected so as to keep the base bias relatively constant when AGC action occurs. With +3.6 v. DC at the base of transistor 40, junction point C will be at approximately +3.0 v. DC. The voltage divider comprising resistors 60 and 62 provides approximately +1.3 v. DC bias at the base of transistor 38. With these bias conditions and insufficient AGC voltage to forward bias transistor 42, transistors 38 and 40 are fully conducting and control transistor 42 is "off." In this state, maximum gain is realized for the cascode amplifier.

The circuit configuration and function of the transistors 40 and 42 combination is very similar to that of the FIG. 1 circuit. The emitters are directly connected together at a junction point C, the bases are coupled together to a common point, namely ground, via capacitors 64 and 66. the collector circuits and base bias circuits are similar to that for transistors 10 and 12 in FIG. 1, and the input signal is coupled across the base-emitter electrodes of the amplifier transistor 40. As the AGC voltage at the base of transistor 42 is increased to approach the bias at the base of transistor 40, transistor 42 will begin to conduct. With transistor 42 conducting, it shunts a portion of the signal current at the collector of transistor 38 (junction point C) to ground through capacitor 54. Also, the D.C. voltage at junction point C will increase with increasing AGC signal to thereby apply a reverse bias action to the fixed base bias transistor 40. In this manner the emitter current and signal gain of transistor 40 are reduced.

Active negative feedback for transistor 40 is controlled by transistor 42 in a manner quite similar to that described with respect to amplifier transistor 10 and control transistor 12. Transistor 42 provides the AGC controlled signal shunt path across the input and common terminals of the transistor 40 amplifier via the emitter-base of transistor 42 and capacitor 66. With this configuration the increased gain of transistor 42 with increased AGC voltage tends to stabilize the signal voltage, $e$, at junction point C at a relatively constant level, even though the gain and base-emitter signal current, $i$, of transistor 40 are being reduced. Consequently, the effective signal impedance for the emitter of transistor 40 will increase as the AGC voltage increases and $i$ becomes smaller with constant $e$. And, as pointed out previously, by variation of the emitter impedance in this manner, increasing AGC voltage is operative to supply in-phase negative feedback to transistor 40 which reduces its gain and maintains linearity. Hence, the gain of transistor 40 is controlled in a reciprocal manner with respect to the gain variations of transistor 42 from full on to cut-off by the cooperative action of signal shunting, reverse biasing and negative feedback. Further, since transistors 40 and 42 have a common input terminal at junction point C and their gains vary in a reciprocal manner, the input load as seen at junction point C remains relatively constant with varying AGC. The output capacity also remains relatively constant since the base bias and collector supply voltages of transistor 40 are respectively held fixed.

To further enhance the linearity of the cascode amplifier operation, it will be noted that the bias for transistor 38 is derived from the D.C. voltage at point C. As input signal strength increases, the AGC bias voltage at the base of control transistor 42, of course, also increases proportionately. This action, as noted previously, results in a proportionate increase in the D.C. voltage at junction point C. Consequently, the forward bias of the base-emitter of transistor 38 is increased, via resistor 60, with increasing signal levels to thereby maintain linearity of operation. That is, it prevents transistor 38 from being overdriven by a strong input signal, with resulting clipping and distortion.

Figure 3:
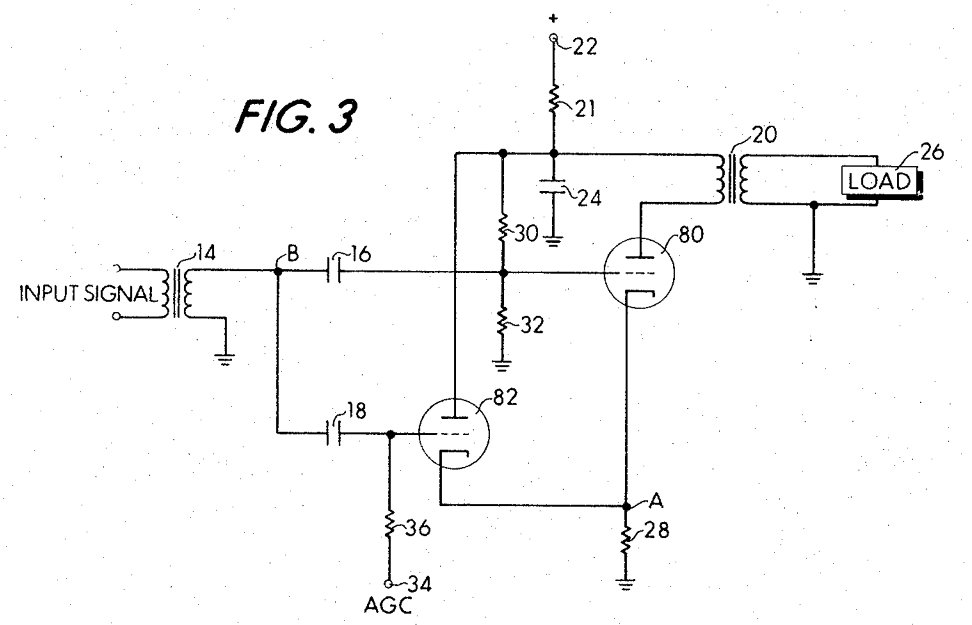
FIG. 3 is a schematic diagram of a vacuum tube embodiment of the invention, corresponding generally to the circuit configuration of FIG. 1.
Figure 4:
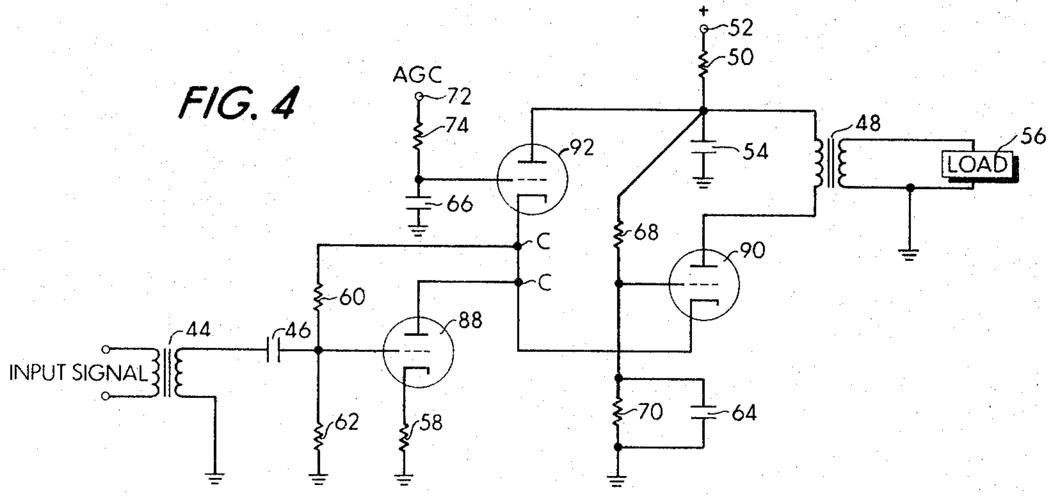
FIG. 4 is a schematic diagram of a vacuum tube embodiment of the invention, the circuit configuration being similar to that of FIG. 2.

While the invention has thus far been described as embodied in transistorized circuits, the advantages thereof are also obtainable when vacuum tubes are used as the active elements. Vacuum tube circuit configurations analogous to FIGS. 1 and 2 are shown in FIGS. 3 and 4, respectively, circuit components having functions similar to those in the transistor circuits, except the vacuum tubes, being labeled with the same numerals. The circuit values, of course, are modified to be compatible with the characteristics of vacuum tubes. Referring to FIG. 3, vacuum tube 80, substituted for transistor 10 is arranged in a common cathode configuration having its cathode connected through a resistor 28 to ground, its anode connected through the primary winding of matching transformer 20, and resistor 21 to a source of positive voltage at terminal 22, and the input signal applied to its grid electrode. Vacuum tube 82, in a common anode or cathode follower configuration, is substituted for the control transistor 12; its cathode is connected directly to the cathode of vacuum tube 80 at junction point A; its anode is connected to a positive voltage source 22 through resistor 21; and, the AGC signal is applied to its grid electrode, the grids of tubes 80 and 82 being coupled to a common input signal at junction point B via capacitors 16 and 18, respectively. In FIG. 4 common cathode amplifier tube 88 is substituted for transistor 38, grounded grid amplifier 90 is substituted for transistor 40, and grounded grid amplifier 92 is substituted for control transistor 42. Tubes 88 and 90, of course, comprise the cascode amplifier stage. The input signal is coupled to the gride of tube 88, the cathode of which is connected to ground via resistor 58 and the anode of which is connected to the cathodes of tubes 90 and 92 at a junction point C. The grid of tube 90 is coupled to ground via capacitor 64, and its anode is connected through the primary winding of the matching transformer 48 and resistor 50 to a source of positive voltage at terminal 52. The anode of tube 92 is connected to a source of positive voltage derived from terminal 52 via resistor 50 and its grid electrode is coupled to ground via capacitor 66. The AGC voltage is applied as a grid bias for tube 92.

From the foregoing it is seen that applicant has provided an automatic gain control circuit which is particularly suitable for transistorized wide dynamic range amplifiers in that it provides greater control range per stage with improved linearity over the entire control range, thereby significantly reducing intermodulation distortion and harmonic generation in the output at high input signal levels. Further this AGC concept provides the additional advantages of maintaining a relatively constant input impedance and output capacity with variations in gain control. In essence, these advantages are achieved by shunting the input terminal to common terminal signal path of an amplifier stage with a control amplifier which operates in response to an AGC signal to control the gain of the amplifier stage by the mutually assisting circuit actions of signal current shunting, reverse biasing, and active negative feedback. In a second embodiment of the invention, a cascode amplifier comprising a first transistor connected in a common emitter configuration and a second transistor connected as a common base is controlled by a third transistor, of common base configuration, which is connected so as to control the gain of the second transistor. The junction of the emitters of the second and third transistors is also connected through a resistor to the base of the first transistor, thereby to increase the forward bias of the first transistor in the presence of strong input signals to assure linearity of operation. This second embodiment, in addition to affording the above noted advantages in AGC characteristics, obviates the need for additional neutralizing circuitry. The circuit is also applicable to vacuum tube amplifiers as just described with reference to FIGS. 3 and 4.

Although the circuits of FIGS. 1–4 have been described with a direct current connection between the emitter or cathode of the control amplifier and the emitter or cathode of the transistor or tube in the amplifier stage, this connection may comprise an A.C. coupling through a capacitor, thereby providing the circuit actions of shunting and negative feedback without reverse biasing. It is applicant's intention, therefore, that the invention not be limited to what has been specifically shown and described except insofar as such limitations appear in the appended claims.

I claim:

1. In a combination, first, second and third amplifiers each having input, output and common terminals, a source of reference potential, means respectively connecting the common terminals of said first, second, and third amplifiers to said source of reference potential, means for coupling an input signal to the input terminal of said first amplifier, direct current circuit means connecting the output terminal of said first amplifier in parallel to the input terminals of said second and third amplifiers, a load circuit connected to the output terminal of said second amplifier, said first and second amplifiers operating as a cascode amplifier stage, means connecting the output terminal of said third amplifier to said source of reference potential, means connected the common terminal of said second amplifier for maintaining a substantially constant direct current bias voltage at the common terminal of said second amplifier, direct current means connecting the input terminal of said third amplifier to the input terminal of said first amplifier, and a source of direct current control voltage connected to the common terminal of said third amplifier, the magnitude of said control voltage varying with the amplitude of said input signal, the gain and conductivity of said third amplifier varying in response to said control voltage to thereby vary the effective signal impedance and direct current bias voltage at the input terminal of said second amplifier and the signal current flow in a shunt path to said source of reference potential via said third amplifier in a cooperative manner to control the gain of said second amplifier, the gain of said second amplifier thereby being caused to vary inversely proportional to gain variations of said third amplifier, said third amplifier also being operative to proportionally vary the forward bias at the input terminal of said first amplifier in response to said control voltage.

2. In combination with a cascode amplifier circuit including first and second transistors each having collector, emitter and base electrodes, means for coupling an input signal to the base of said first transistor, a load circuit connected to the collector of said second transistor, means connecting the collector of said first transistor to the emitter of said second transistor, a source of reference potential, and means respectively connecting the emitter of said first transistor and the base of said second transistor to said source of reference potential, a gain control circuit for said amplifier comprising a third transistor having an emitter electrode connected to the collector and base of said first transistor, and base and collector electrodes each capacitively coupled to said source of reference potential, and a source of direct current gain control voltage connected to the base electrode of said third transistor and operative to vary the gain of said third transistor to thereby vary the negative feedback, and hence the gain, of said second transistor in response to said gain control voltage, the gain variation of said second transistor being inversely proportional to the gain variation of said third transistor, said third transistor also being operative to proportionally vary the base-emitter forward bias of said first transistor in response to said control voltage.

3. In combination with a common emitter and a first common base amplifier connected together as a cascode amplifier between an input signal source and output load circuit, an automatic gain control circuit comprising a second common base amplifier connected between the signal path interconnection of said common emitter and first common base amplifiers and a source of signal reference potential, means connecting the direct current output of said second common base amplifier to the input of said common emitter amplifier, and a source of automatic gain control voltage connected to said second common base amplifier and operative to control the gain of said second common base amplifier to thereby vary the base-emitter degeneration of said first common base amplifier in response to said automatic gain control voltage, said second common base amplifier also being operative to proportionally vary the forward bias of said common emitter amplifier in response to said control voltage.

4. In combination, first, second and third transistor amplifiers each having collector, emitter and base electrodes, means for coupling an input signal to the base of said first transistor, circuit means directly connecting the collector of said first transistor in parallel to the emitters of said second and third transistors, a load circuit connected to the collector terminal of said second transistor, a source of reference potential, means respectively connecting the emitter of said first transistor, the bases of said second and third transistors and the collector of said third transistor to said source of reference potential, said first and second transistor amplifiers being operative as a cascode amplifier stage, means connected to the base of said second transistor for maintaining a substantially constant direct current bias voltage at the base of said second transistor, direct current means connecting the emitter of said third transistor to the base of the said first transistor, and a source of automatic gain control signal connected to the base of said third transistor and operative to vary the gain and conductivity of said third transistor amplifier to thereby vary the effective signal impedance and direct current bias voltage at the emitter of said second transistor and the signal current flow in a shunt path to said source of reference potential via said third transistor amplifier and consequently cooperatively vary the negative feedback and direct current bias of said second transistor amplifier and signal shunting effect thereby to control the gain of said second transistor amplifier in response to said automatic gain control signal, said third transistor also being operative to proportionally vary the base-emitter forward bias of said first transistor in response to said control signal.

5. In combination, first, second and third electron tube amplifiers each having anode, cathode and control grid electrodes, means for coupling an input signal to the control grid of said first tube, means connecting the anode of said first tube in parallel to the cathodes of said second and third tubes, a load circuit connected to the anode of said second tube, a source of reference potential, means respectively connecting the cathode of said first tube, the control grids of said second and third tubes and the anode of said third tube to said source of reference potential, said first and second electron tube amplifiers operating as a cascode amplifier stage, direct current means connecting the cathode of said third tube to the control grid of said first tube, and a source of automatic gain control voltage connected to the control grid of said third tube and operative to vary the gain of said third electron tube amplifier to thereby vary the effective signal impedance at the cathode of said second tube which proportionally varies the cathode degeneration of said second tube to control the gain of said second electron tube in response to said automatic gain control voltage, said third tube also being operative to proportionally vary the grid bias of said first tube in response to said control voltage.

6. In combination, first, second and third amplifiers each having first, second and third electrodes, a signal source coupled to the first electrode of said first amplifier, means connecting the third electrode of said first amplifier in parallel to the second electrodes of said second and third amplifiers, means connecting the first electrode of said second amplifier to the first electrode of said third amplifier, means connecting the second electrode of said first amplifier and the third electrode of said third amplifier to a point of signal reference potential, said first and second amplifiers being operative as a cascode amplifier stage with the third electrode of said second amplifier being the output terminal of said cascode amplifier, direct current circuit means connecting the second electrode of said third amplifier to the first electrode of said first amplifier, a source of direct current control voltage, and means for applying said direct current voltage to control the operating point of said third amplifier to thereby vary the gain of said third amplifier in response to said voltage, said third amplifier thereby being operative to vary the degenerative feedback of said second amplifier to control the gain of said second amplifier in a reciprocal manner with respect to the gain variations of said third amplifier, and said third amplifier also being operative to proportionally vary the forward bias at the first electrode of said first amplifier in response to said direct current voltage.

7. In combination, first, second and third transistor amplifiers each having collector, emitter and base electrodes, means for coupling a signal source to the base of said first transistor, means connecting the collector of said first transistor in parallel to the emitters of said second and third transistors, means including a load circuit connected to the collector of said second transistor, means connecting the emitter of said first transistor, the bases of said second and third transistors and the collector of said third transistor to a point of signal reference potential, said first and second transistor amplifiers being operative as a cascode amplifier stage, direct current circuit means connecting the emitter of said third transistor to the base of said first transistor, and a source of direct current control voltage connected to the base electrode of said third transistor for controlling the base bias and thereby the gain of said third transistor amplifier, said third transistor amplifier thereby being operative to vary the emitter degeneration of said second transistor amplifier thereby to control the gain of said second amplifier in a reciprocal manner with respect to gain variations of said third transistor amplifier, said third transistor also being operative to proportionally vary the base-emitter forward bias of said first transistor in response to said control voltage.

8. In combination with a common emitter and a first common base amplifier connected together as a cascode amplifier between an input signal source and output load circuit, an automatic gain control circuit comprising a second common base amplifier connected between the signal path interconnection of said common emitter and first common base amplifiers and a source of signal reference potential, and a source of automatic gain control voltage connected to said second common base amplifier and operative to control the gain of said second common base amplifier to thereby vary the base-emitter degeneration of said first common base amplifier in response to said automatic gain control voltage.

9. In combination, first, second and third transistor amplifiers each having collector, emitter and base electrodes, means for coupling an input signal to the base of said first transistor, circuit means directly connecting the collector of said first transistor in parallel to the emitters of said second and third transistors, a load circuit connected to the collector of said second transistor, a source of reference potential, means respectively connecting the emitter of said first transistor, the bases of said second and third transistors and the collector of said third transistor to said source of reference potential, said first and second transistor amplifiers being operative as a cascode amplifier stage, means connected to the base of said second transistor for maintaining a substantially constant direct current bias voltage at the base of said second transistor, and a source of automatic gain control signal connected to the base of said third transistor and operative to vary the gain and conductivity of said third transistor amplifier to thereby vary the effective signal impedance and direct current bias voltage at the emitter of said second transistor and the signal current flow in a shunt path to said source of reference potential via said third transistor amplifier and consequently cooperatively vary the negative feedback and direct current bias of said second transistor amplifier and signal shunting effect thereby to control the gain of said second transistor amplifier in response to said automatic gain control signal.

10. In combination with a common emitter and a first common base amplifier connected together as a cascode amplifier between an input signal source and an output load circuit, a gain control circuit comprising a second common base amplifier connected between the signal path interconnection of said common emitter and first common base amplifiers and a source of signal reference potential, a source of direct current control voltage, and means for applying said direct current voltage to control both the gain of said second common base amplifier and the base-emitter degeneration of said first common base amplifier in response to said voltage.

References Cited

UNITED STATES PATENTS 3,036,275 5/1962 Harmer ............. 330—29

FOREIGN PATENTS 936,629 9/1963 Great Britain.

ROY LAKE, *Primary Examiner.*

J. B. MULLINS, *Assistant Examiner.*